United States Patent [19]
Pendse

[11] Patent Number: 5,528,462
[45] Date of Patent: Jun. 18, 1996

[54] DIRECT CHIP CONNECTION USING DEMOUNTABLE FLIP CHIP PACKAGE

[76] Inventor: Rajendra D. Pendse, 5245 Diamond Common, Fremont, Calif. 94555

[21] Appl. No.: 267,629

[22] Filed: Jun. 29, 1994

[51] Int. Cl.$^6$ .................................................. H05K 7/10
[52] U.S. Cl. .................. 361/767; 361/769; 361/770; 257/778; 29/832; 29/842
[58] Field of Search ................... 361/767–770, 361/718–721, 740, 742, 758–759, 804; 257/778; 174/52.1, 52.4; 29/832, 842

[56] References Cited

U.S. PATENT DOCUMENTS

| | | |
|---|---|---|
| 4,561,011 | 12/1985 | Kohara et al. . |
| 5,019,940 | 5/1991 | Clemens . |
| 5,089,936 | 2/1992 | Kojima et al. . |

OTHER PUBLICATIONS

Ken Gilleo, "Direct Chip Interconnect Using Polymer Bonding", IEEE, 1989 pp. 37–49.
Ken Smith, "An Inexpensive High Frequency, High Power, VLSI Chip Carrier", IEEE, 1985 Custom Integrated Circuits Conference, pp. 42–45.
Nagesh R. Basavanhally, David D. Chang, Benjamin H. Cranston and Steven G. Seger, Jr., "Direct Chip Interconnect with Adhesive–Connector Films", 1992, IEEE, pp. 487–491.
Kenzo Hatada, et al.: A New LSI Bonding Technology "Micron Bump Bonding Assembly Technology", IEEE–CHMT Proceedings, 1988, pp. 23–27.

Primary Examiner—Bot L. Ledynh

[57] ABSTRACT

The present invention provides an easily reworkable demountable means of electrically interconnecting an integrated circuit die to a substrate. The electrical assembly is comprised of an integrated circuit die having contact areas on a first surface, a substrate having contact areas aligned with the contact areas of the die for providing electrical connection to the integrated circuit die, and a compression means for maintaining the integrated circuit die contacts in electrical communication with the contacts of the substrate. The compression means typically includes a two-part spring system which provides superior electrical contact by causing the curvature of the integrated circuit die to be in the same direction as the curvature of the substrate.

15 Claims, 9 Drawing Sheets

DIRECT CHIP CONNECTION USING DEMOUNTABLE FLIP CHIP PACKAGE

BACKGROUND OF THE INVENTION

The present invention is directed towards packaging for semiconductor devices and more specifically towards a demountable flip chip package which can be easily reworked.

Multi-chip modules which include a number of integrated circuit die in a single package play an increasingly important role in the electronics industry. An important concern in the fabrication of multi-chip modules is the method of electrically connecting the integrated circuit die to the module. Tape Automated Bonding (TAB) and Flip Chip packages are two popular packaging solutions for packaging high lead count VLSI die requiring high thermal dissipation and good electrical performance.

Tape automated bonding involves the formation of a spider-like metal pattern of conductive fingers which radiate outwardly from the integrated circuit die for attachment to contact sites of a substrate. Although TAB interconnection provides a viable means of interconnection for high pin count integrated circuits, it is associated with a number of disadvantages. First, TAB interconnection requires incorporation of an additional element (the tape) to act as an intermediary between the die and substrate thus adding to the signal path. Further, TAB interconnection requires a complicated assembly procedure involving the steps of inner and outer lead bonding. Finally, the high pin count extendability of TAB is limited by its requirement of a peripheral bond pad configuration (as opposed to an area array configuration) on the integrated circuit die.

The flip chip package has an area array configuration increasing the number of interconnections available compared to the standard TAB package. In a flip chip package, the integrated circuit die is fixed face down onto the substrate and solder bumps are formed at the input/output pads of the die. After solder bump formation, the temperature is increased to cause the solder bumps to reflow for direct bonding of the input/output pads of the die to contact sites on the substrate. Although flip chip interconnect schemes eliminate the limitation of peripheral bond pad arrangement associated with TAB bonding, flip chip interconnection has the disadvantage that test and burn-in of the integrated circuit die cannot be performed before board level assembly. Further, flip chip interconnection includes a fairly involved chip-to-substrate assembly procedure which requires the added investment and associated cost of solder bump technology.

In both conventional TAB and flip chip interconnections, the input/output pads or leads are soldered to contact sites on the substrate making it difficult to repair or replace defective die. Conventional TAB technology is based on soldering the tape outer leads to the matching pattern on the substrate. Conventional flip chip technology requires soldering the solder bumps formed on the input/output pads of the integrated circuit die onto matching pads on the substrate. The soldering operation makes rework of the integrated circuit die extremely difficult under production conditions. Because of the difficulty of removing and resoldering the integrated circuit die, the entire multi-chip module may have to be discarded when there is a single defective die. This problem is exacerbated as the number of die on a multi-chip module increases.

One solution to the problem of reworkability is to provide a pressure connection scheme to establish electrical connection of the pads on the die with the matching connection points on the substrate. FIG. 1 illustrates a pressure connection scheme for an electrical assembly. The electrical assembly 100 is comprised of a die pressure plate 102, integrated circuit die 104, a substrate 106, a load distributing member 108 (typically an elastomer), a backing plate 110, and an external load 112. One of many possible aligning schemes (not shown) may be used to align the contact pads on the die with the matching pads on the substrate. In order to establish the electrical connection, the die 104 is aligned to the substrate 106 and the die pressure plate 102 is pressed towards the backing plate 110 by means of an external load 112.

While the above described scheme is fairly straightforward, the key challenge lies in implementing the previously described assembly on the scale of a package-like stand-alone component. In other words, the entire force delivery system and the alignment scheme must be incorporated in the package substrate assembly itself, yet the package must be small enough (in size and weight) so as to be suitable for a MCM application. Furthermore, the package must also provide a means of environmentally protecting the die. Finally, the design of the assembly must ensure the long term reliability of the pressure connections.

A reliable, low cost electrical assembly which provides excellent electrical contact wherein assembly components can be readily demounted and reworked without damaging the die or substrate is needed.

SUMMARY OF THE INVENTION

The present invention provides a structure and method of construction of an electrical assembly that permits easy reworkability and demountability of an integrated circuit die from a substrate. The electrical assembly is comprised of an integrated circuit die having contact areas on a first surface, a substrate having a matching pattern of contact areas aligned with the contact areas of the die, and a compression means for maintaining the integrated circuit die contacts in electrical communication with the contacts of the substrate. In one embodiment, the compression means includes a two-part spring system which provides superior pressure connection by causing the curvature of the integrated circuit die to be in the same direction of curvature as the substrate.

The die is attached to a rigid die attach structure such that contact pads of the die are aligned with the corresponding or matching contact pads of the substrate. The electrical assembly typically includes a means for self-aligning the two sets of contact areas. Typically, precision shoulder bolts are used to align the plate to the substrate. The threaded portion of the shoulder bolt engages into threaded holes in the die attach structure and the shoulder portion of the shoulder bolt engages with the precision holes in the substrate. Behind the substrate is a spring system typically including an elastomer and a metal plate spacer configuration.

The pressure connection is effected by placing and torquing the shoulder bolts. The electrical assembly typically includes a sealing means for protecting the die from the environment. In the preferred embodiment, the sealing means is a silicone ring placed around the perimeter of the die and sandwiched between the die attach structure and the substrate. When the shoulder bolts are torqued to provide compression, a gasket-like environmental seal is concomitantly provided.

In the preferred embodiment of the present invention, the compression means includes shoulder bolts positioned through openings in the die attach structure, the spring system and the interconnect substrate and a two part spring system coupled to a first side of the substrate. The two part spring system is comprised of a first support plate and a second support plate, wherein the first support plate and the second support plate are separated by a spacer. Typically, the spacer is located near the center of the first and second support plates and 1) maintains a distance between the first and second plates which are substantially parallel and 2) transfers force between the first support plate and the second support plate.

When the shoulder bolts are tightened, the force applied to the periphery of the die attach plate causes the die attach plate to bend, where the direction of curvature of the die attach plate is downwards towards the die. The force applied to the second support plate of the spring system, causes the second support plate to bend so that the direction of curvature is opposite to the direction of the die attach plate. However, the spacer transfers a force from the second support plate to the center of the first support plate causing the first support plate to bend around the point of application of the force in the same direction of curvature as the die. Since the substrate is coupled to the first support plate, the substrate also bends in the same as the direction of curvature of the die providing excellent electrical contact. Thus the spring system applies a force to the substrate which causes the curvature of the die and the curvature of the substrate to be in the same direction.

The demountable flip chip may be considered as a packaging solution that retains all the advantages of the solder bump flip chip approach while removing the drawbacks of pre-testability and rework that are partly responsible for the lack of acceptance of flip chip technology in cost sensitive applications such as workstations and minicomputers. In the preferred embodiment, the integrated circuit die is connected to the substrate via contact pads in a flip chip area array configuration. Thus all the advantages associated with an area array organization of pads on the die apply to demountable flip chip. These include flexibility of placing pads at locations that minimize signal path parasitics, the potential to shrink die size, and the potential to reduce I/O count by using fewer ground and power pins. There is minimal incremental cost in scaling to higher I/O's.

Further, because the electrical assembly described by the present invention is a demountable component it provides easy reworkability. Full test and burn-in can be performed on the component before board level assembly, a feature that conventional flip chips lack. Thus, demountable flip chip packages provide substantial prototyping and testing benefits because the multi-chip package can be tested with known good die. Since individual die can be removed from the multi-chip module, they can be tested in the real operating environment and be replaced if defective. This in-situ testing eliminates the need for at-speed testing which is considered a serious obstacle in the implementation of multi-chip modules.

An additional benefit to the demountable flip chip described by the present invention is the high thermal performance. In the preferred embodiment, the die attach plate is a heat sink. Thus, thermal performance is improved by virtue of the dual heat flow paths; one heat path from the back of the die through the spreader, the other heat path from the front of the die through the substrate. Further, the demountable flip chip does not require matching the coefficients of thermal expansion of the die and the substrate because of the separable nature of the die-to-substrate interface. This greatly expands the choice of substrates, adding to process flexibility.

In a further aspect, the present invention provides a method of providing an electronic assembly by mounting a plurality of integrated circuit die to a die attach structure, aligning the contact pads on the active face of integrated circuit die with the contact pads on the substrate, and applying a force so that the plurality of integrated circuit die are in electrical contact with the contact pads of the substrate. The forces applied include a force exerted by the shoulder bolts extending through the openings in the die attach structure and forcing the die attach structure towards the spring system and a force exerted by the spring system. The demountable flip chip has a simple self-aligned assembly, by virtue of the shoulder bolts extending through the openings in the die attach plate and the spring system which provide alignment of the die to the substrate.

The electrical assembly provided by the present invention provides an extremely simple assembly procedure. Many of the expensive processes associated with conventional TAB assembly such as wafer bumping, tape design, inner lead bonding, encapsulation, outer-lead bonding, and soldering are eliminated. Similarly, many of the expensive processes associated with flip chip assembly such as solder bumping, reflow, fluxing and flux cleaning are eliminated.

A further understanding of the nature and advantage of the invention described herein may be realized by reference to the remaining portions of the specification and the attached drawings.

DESCRIPTION OF THE PREFERRED EMBODIMENTS

Figure 1:
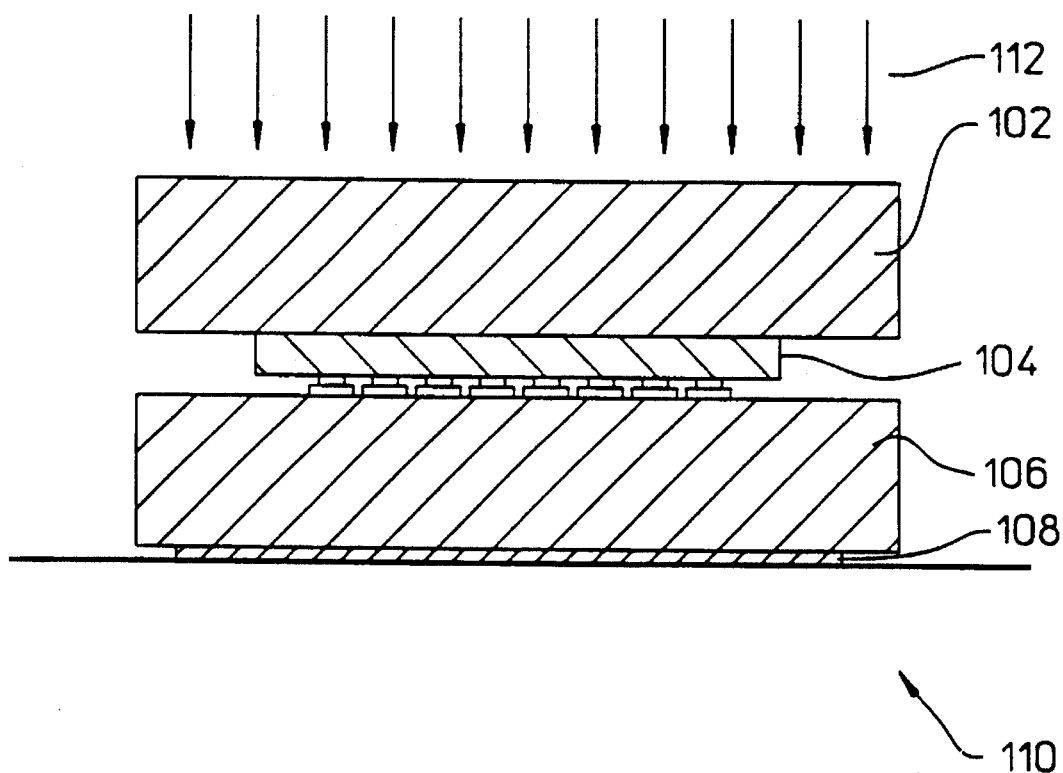
FIG. 1 shows a generic pressure interconnect configuration for an electrical assembly.

The present invention provides a mechanical and electrical assembly that is easily reworkable and provides a means of electrically interconnecting an integrated circuit die to a substrate. The electrical assembly 200 is comprised of an integrated circuit die 202 having contact areas 204, a substrate 208 having contact areas 210 aligned with the contact areas 204 of the die 202 for providing electrical connection to the integrated circuit die 202 and a compression means for maintaining the integrated circuit die contacts in electrical communication with the contacts of the substrate. Although in the embodiment shown in FIG. 2, an integrated circuit die 202 is shown positioned above a substrate 208, the present interconnection scheme may also be used to electrically join components other than integrated circuit die to a substrate.

In accordance with the invention, FIG. 2 illustrates a cross-sectional view of the electronic assembly 200. FIG. 2A shows an exploded view of the preferred embodiment of the electronic assembly 200. FIG. 2B shows an assembled view of the electronic assembly shown in FIG. 2A. FIGS. 2C, 2D and 2E show an assembled view of an electronic assembly according to the present invention having alternative spring systems to the embodiment shown in FIGS. 2A and 2B.

In FIG. 2, the integrated circuit die 202 is mounted to a rigid die attach plate 212. The die attach plate 212 preferably acts as a heat sink and is typically comprised of a metal or other material which withdraws heat from the die 202. The integrated circuit die 202 may be mounted or attached to the die attach plate by an adhesive layer 214 or may be attached by alternative means. In one embodiment, the adhesive layer 214 is a thin sheet of thermal interface material 214, such as boron nitride filled silicone which provides a good thermal contact.

In the preferred embodiment, a plurality of integrated circuit die are placed on the substrate. FIG. 3 shows an exploded view of the placement of one demountable flip chip 308 on a substrate 304 designed to support four demountable flip chips. Similar to the electrical assembly shown in FIG. 2, the electrical assembly shown in FIG. 3 is typically comprised of a heat sink 306, an integrated circuit die 308, a substrate 304, an elastomer 310 and first and second plates 312, 314 separated by a spacer 316. Shoulder bolts 318a, 318b, 318c and 318d in combination with the spring system 320 comprised of plates 312, 314 and spacer 316 are used to compress the die 308 towards the substrate 304. Although FIG. 3 shows flip chip 302 having its own heat sink or die attach plate, the heat sink may be extended so that more than one integrated circuit die may share the heat sink.

Referring to FIG. 2, the integrated circuit die 202 has first and second opposing sides 220 and 222 respectively. The first side 220 of the die 202 is nonactive. The second side 222 is the active surface of the integrated circuit die 202 and has first contact regions 204. The integrated circuit die 202 is oriented so that the active surface 222, including the active components and electrical connections is facing towards the substrate 208. The inactive side 220 of the integrated circuit die is oriented to face the die attach structure 212. In the preferred embodiment, the integrated circuit has an area array configuration with conductive bumps raised from the first contact areas 204. The integrated die and the substrate have a matching array of I/O pads in an area array arrangement.

The substrate 208 may be a conventional substrate having multiple internal conducting metal layers or alternatively may be a flexible substrate. For example, the substrate may be a flex circuit based on a copper polyimide construction where the precision holes are etched in copper.

Figure 4A:
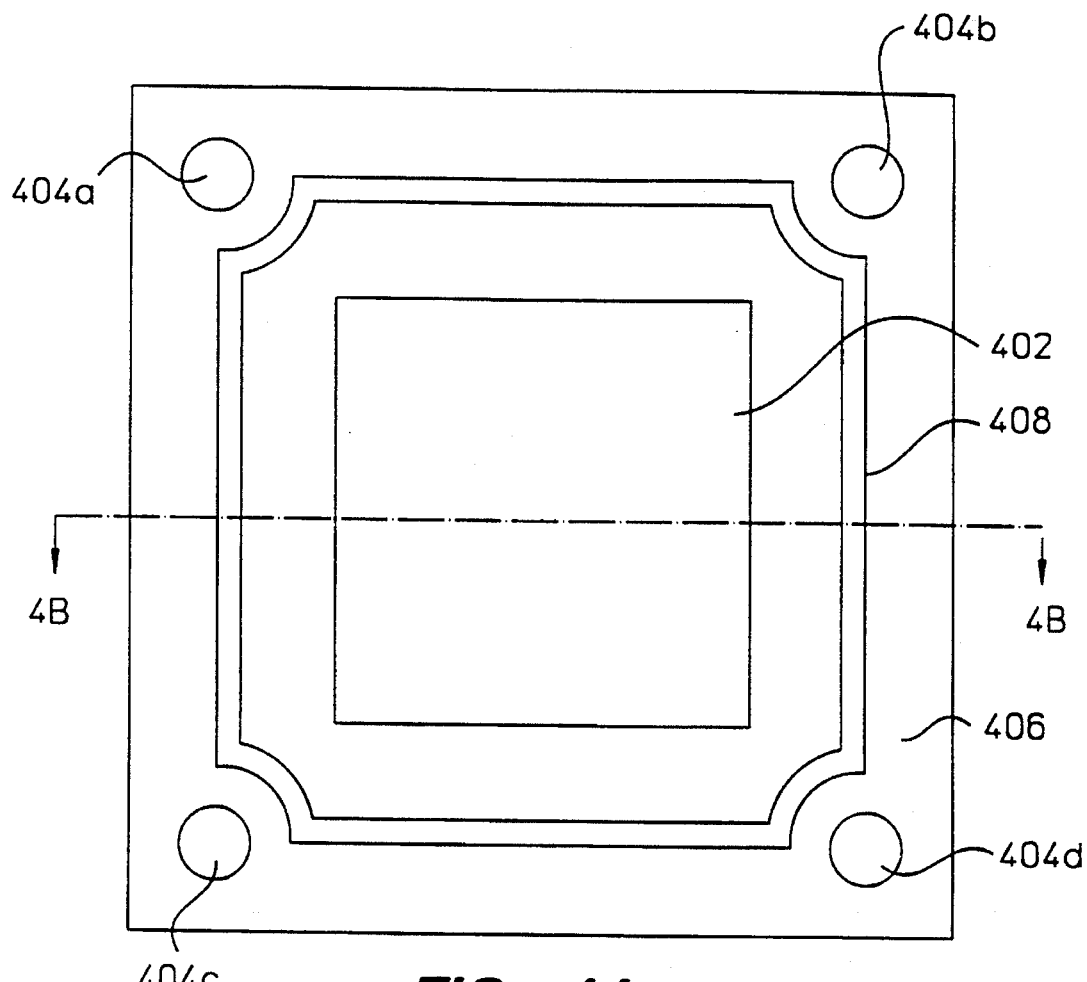
FIG. 4A an 4B show silicone ring placement for embodiment shown in FIG. 2.
Figure 4B:
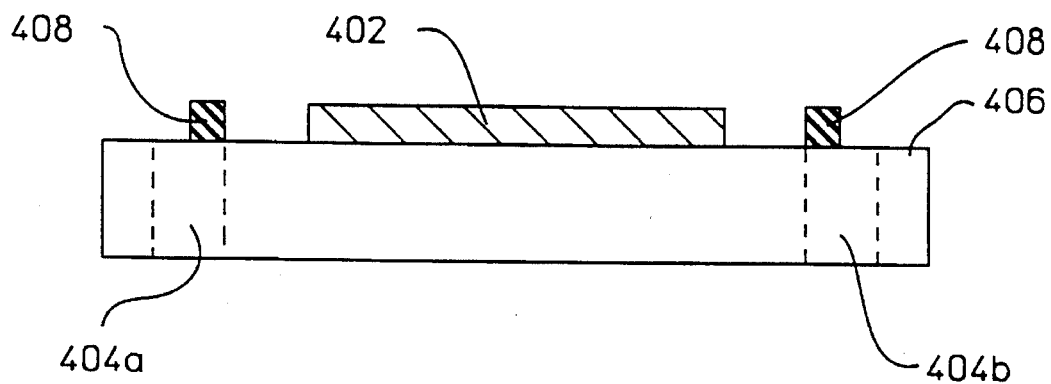

Condensation in the environment can act as an electrolytic conduct inside the integrated circuit assembly causing circuit failure. In the preferred embodiment, a sealing ring 224 is placed along the perimeter of the integrated circuit die between the die attach plate and the substrate. FIG. 4A shows a view of a partial electrical assembly looking up from the integrated circuit die 402 from the contact interface. In FIG. 4, the shoulder bolts which extend through the holes 404a, 404b, 404c, 404d in the die attach plate 406 are omitted for clarity. As can be seen in FIG. 4A, the sealing ring 408 should be positioned so as to not cover the holes 404 in the die attach plate 406. FIG. 4B shows a cross sectional view of the partial assembly along lines A—A.

As previously discussed, one solution to problems associated with reworkability is to provide a pressure contact for electrically interconnecting the contacts of the integrated circuit die to the contacts of the substrate. FIG. 5 shows a force delivery diagram for such a demountable electrical assembly. The electrical assembly 500 is comprised of a heat sink or die attach plate 502, an integrated circuit die 504, a substrate 506, a load distributing member 508 (elastomer), and a base support plate 510. To form an electrical contact, the die attach plate 502 is compressed towards the base support plate 506 causing the die 504 to make contact with the contacts of the substrate 506.

Figure 5A:
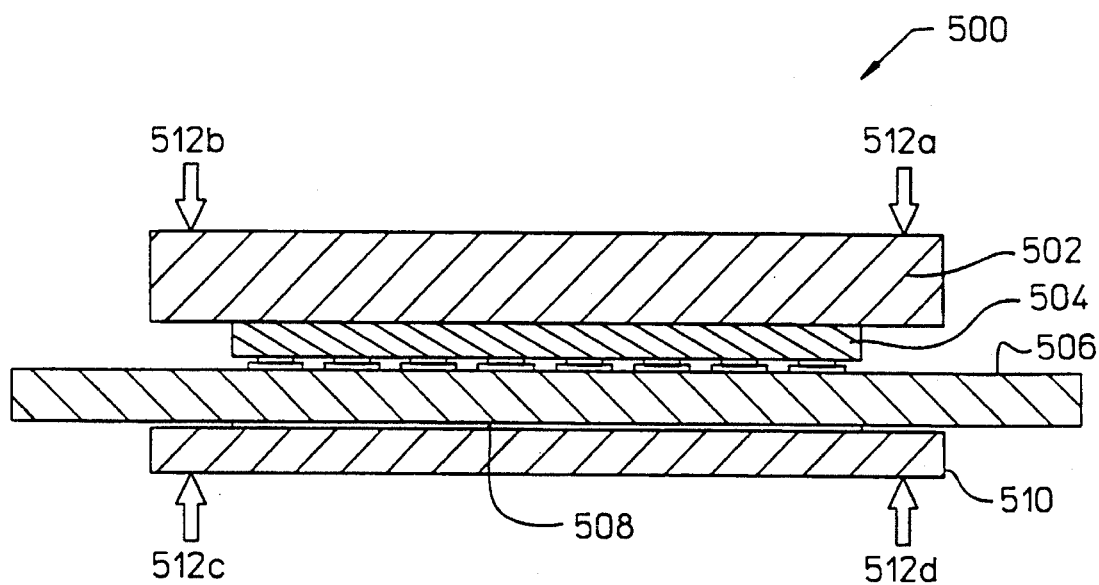
FIGS. 5A and 5B show a force delivery interconnect configuration without a two-part spring system.
Figure 5B:
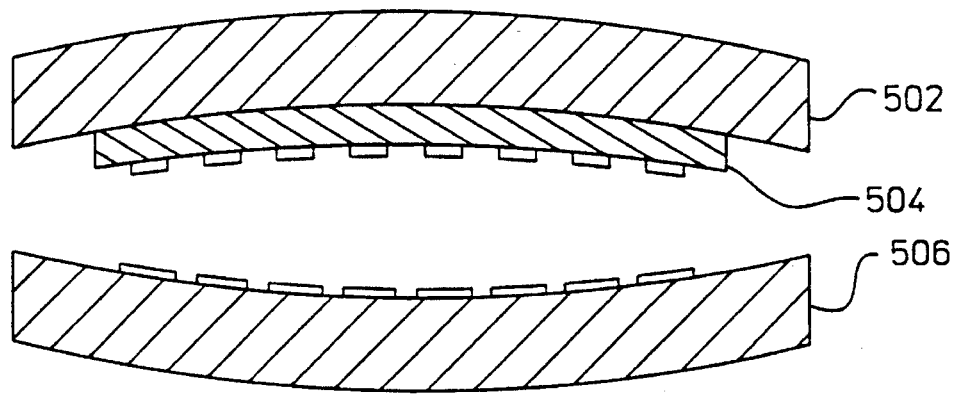

Compressing the die attach plate 502 towards the substrate 506 is typically caused by a pair of shoulder bolts (not shown) extending through the base plate 510 and the die attach plate 502 at the force application points shown by force arrows 512. FIG. 5B shows the die attach plate 502, die 504 and substrate 510 after the application of a clamping force around the die periphery. Unfortunately, as can be seen in FIG. 5B, the direction of curvature of the die 504 is opposite to the direction of curvature of the substrate 506. Because of the opposite nature of the curvatures about the contact interface, the contact pads of the die do not make good electrical contact with the contact pads of the substrate thus providing inadequate electrical connection for the electrical assembly. As illustrated in FIG. 5B, an arrangement as the one shown in FIG. 5A is doomed to fail or perform unreliably due to the opposite nature of curvatures about the contact interface induced by the clamping force.

Referring to FIG. 2, in the preferred embodiment the compression means includes a spring system 226 and fasteners such as shoulder bolts 228. Typically an elastomer 230, is positioned between the substrate 208 and the spring system 226. The elastomer 230 acts as a load distributing member and is used to equalize the load applied across the substrate 208.

In the preferred embodiment, the spring system 226 is a two part spring system coupled to a first side 232 of the substrate 208. A second side 234 of the substrate is coupled to the active side 222 of the integrated circuit die. In the preferred embodiment, the spring system 226 is a two part spring system comprised of a first plate 236 and a second plate 238 separated by a spacer 240. The first and second support plates 236, 238 are typically positioned so that they are substantially parallel to each other, where the separation between the two parallel plates 236, 238 is essentially the height of the spacer 240. The spacer 240 may be part of the first or second plates 236, 238 or alternatively may be a separate part. If a separate part, the spacer 240 is typically adhered to the first and second plates to provide a stable contact point. Alternatively, a notched opening may be formed in the first or second plates 236, 240 in which the spacer 240 may be placed in to provide a mechanically stable contact point.

The spacer 240 is typically only a fraction of the length of the first and second plates 236, 238. The spacer 240 is typically located in the center of the length of the first and second plates 236, 238 and acts as the effect point or point of force transfer. The spacer 240 transfers force from the second plate 238 to the first plate 236 at the center of the first plate 236, ensuring curvature around the center point 242 of the first plate 236.

Referring to FIG. 2, the electrical assembly 200 has a plurality of threaded holes 244, 246, 248 in the die attach plate 212, the substrate 208, and the spring system 226, respectively. The holes 244, 246, 248 are spaced apart and are used for alignment and by means of the shoulder bolts 228 which engage in the holes 244, 246, 248. Electrical contact between the die pads 204 and the substrate pads 210 is established by precisely aligning the die attach plate 212 to the substrate 208 and engaging the shoulder bolts 228 through the spring system 226.

The location of the die 202 mounted on the die attach plate 212 should be precise in relation to the four threaded holes 244 in the die attach plate 212. This can be achieved simply by using a template (for die attachment) that drops into the threaded inserts and has an opening in the center slightly larger than the size of the die. The template is removed after the die attach cure. Further, the location of the four holes in the substrate should be precise in relation to the pattern of the pads on the substrate. Further, the size of the holes should allow the shoulders of the aligning inserts to slide freely through them. In one embodiment, four holes per package may not be necessary. For example in cases where the four demountable flip chips share the same die attach plate or the four die share the same heat spreader, the reduction of holes saves routing space on the substrate.

As the shoulder bolts 228 are threaded into the die attach plate 212, the spring system 226 applies a force to the substrate 208 and the elastomer 230 is compressed thereby forcing the contact pads 204 of the integrated circuit die 202 into contact with the contact pads 210 of the substrate 208. As the spring system is compressed, the first plate of the spring system bows slightly in the same direction as the die and thereby compensating for any bowing of the die.

Figure 2A:
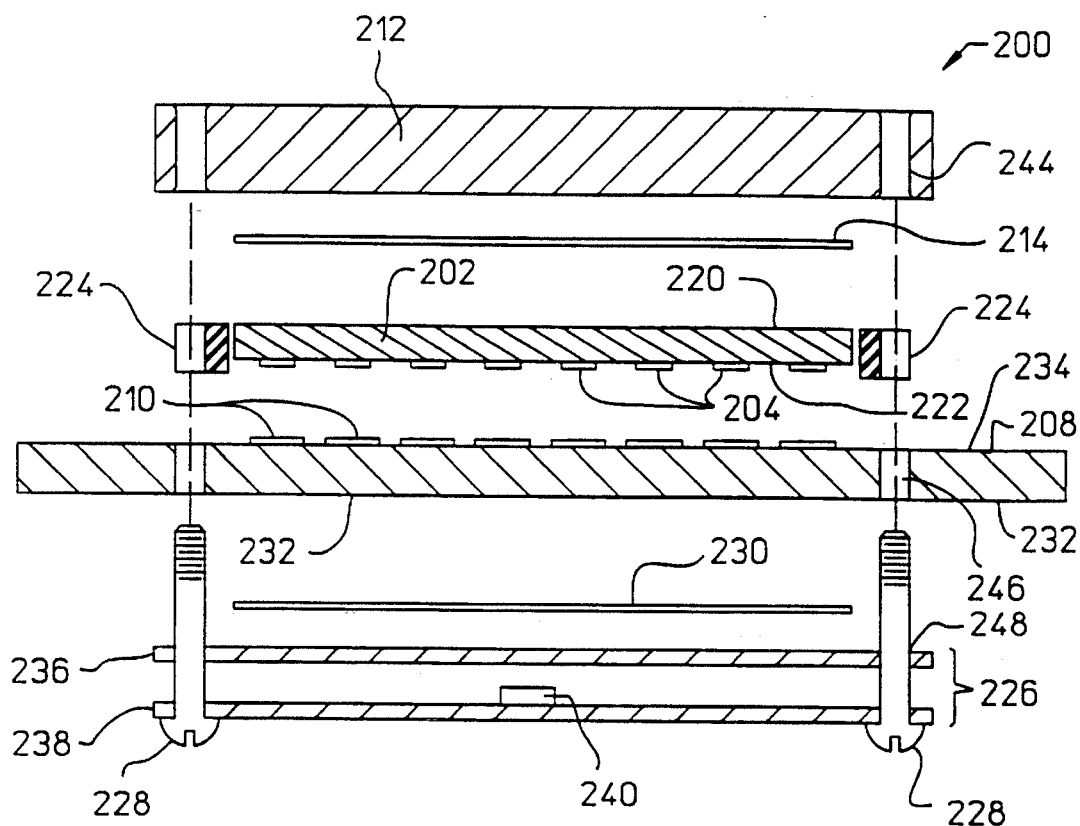
FIG. 2A illustrates an exploded view of the preferred embodiment of the demountable flip chip having a two-part spring system.
Figure 2B:
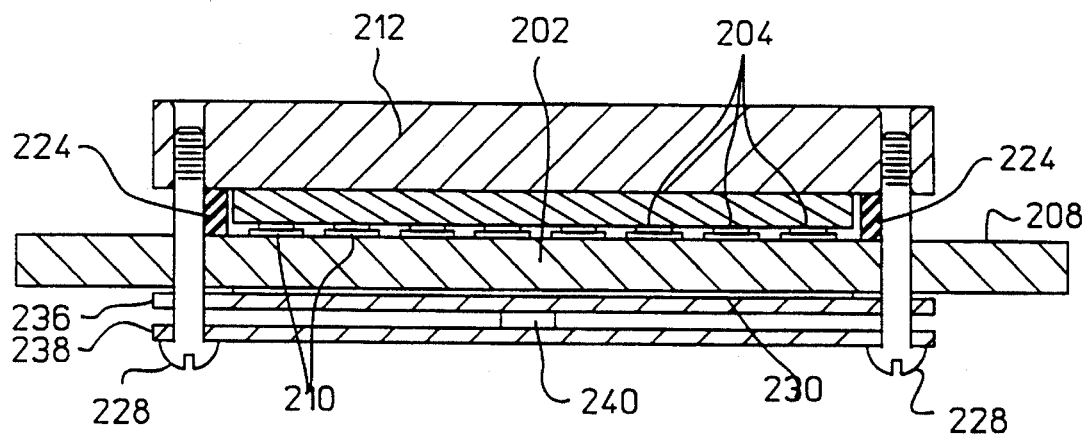
FIG. 2B illustrates the preferred embodiment of the demountable flip chip having a two-part spring system shown in FIG. 2A after assembly.
Figure 2C:
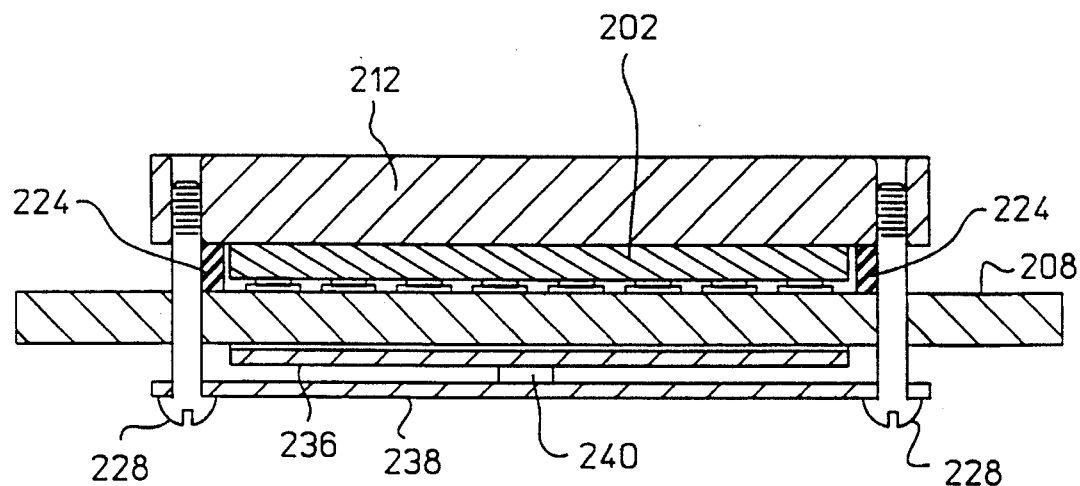
FIGS. 2C, 2D and 2E illustrate an assembled view of alternative spring systems for the embodiment shown in FIGS. 2B.
Figure 2D:
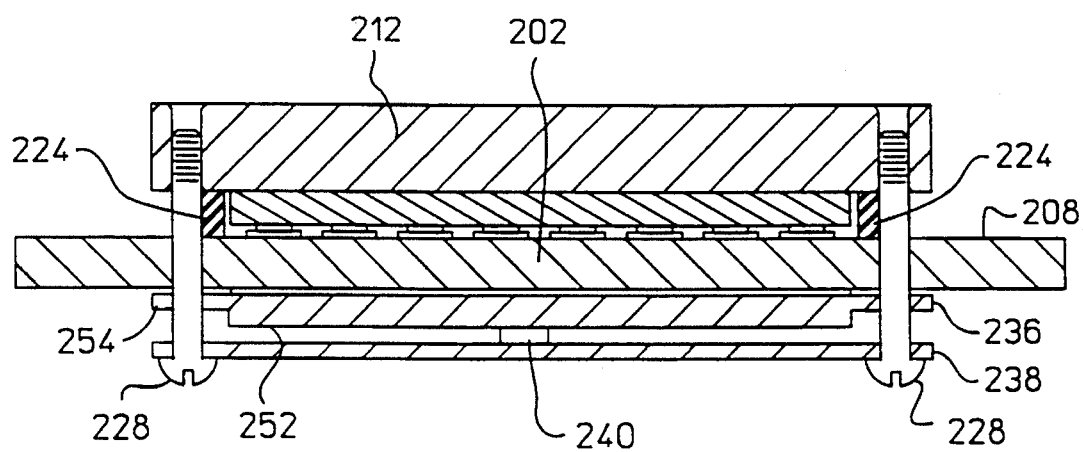
Figure 2E:
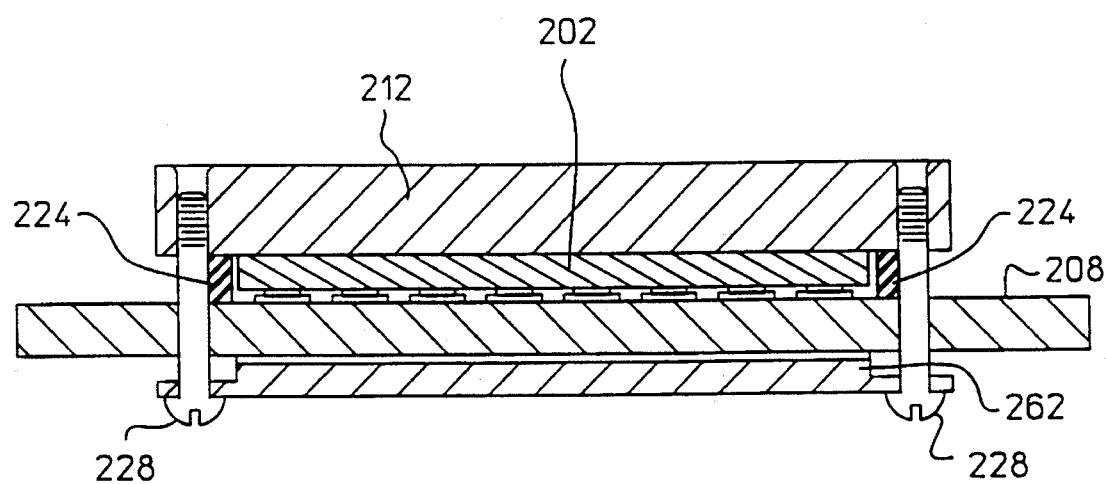
Figure 2F:
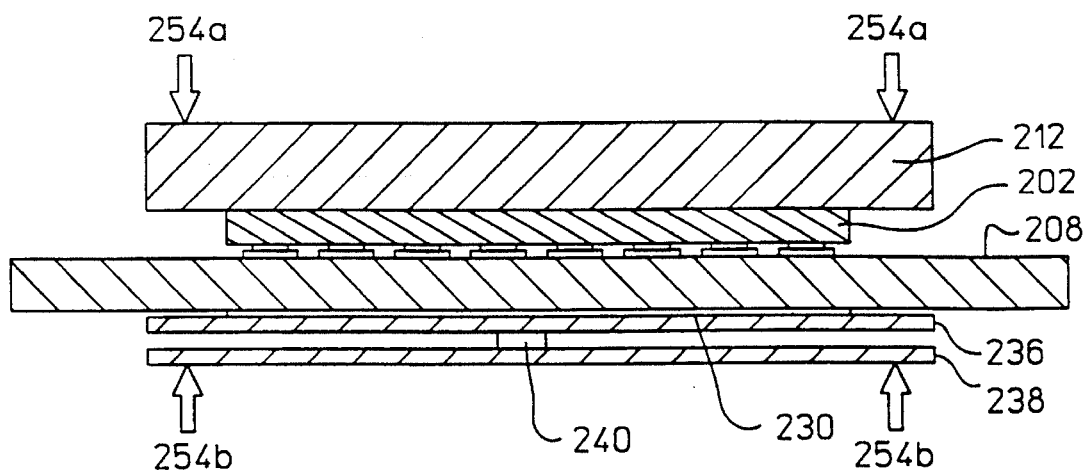
FIG. 2F–2H illustrates the force delivery for the preferred embodiment of the present invention shown in FIG. 2B.
Figure 2G:
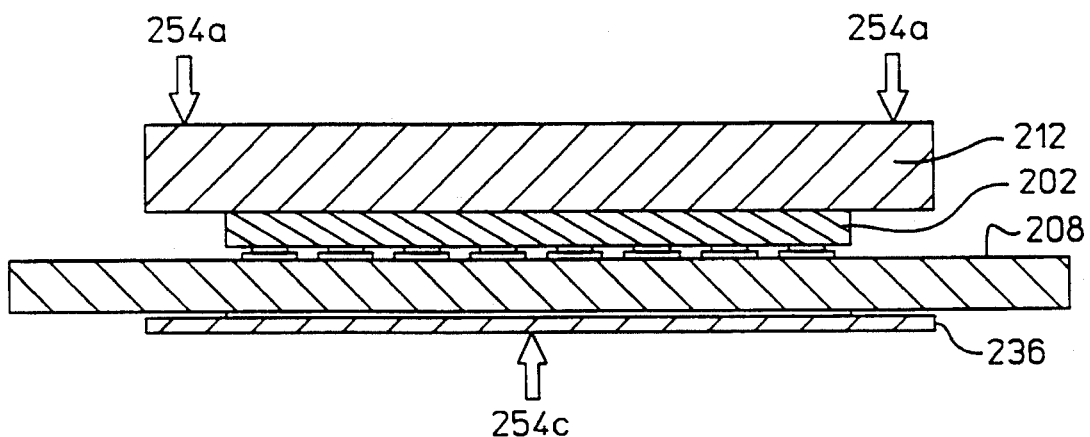
Figure 2H:
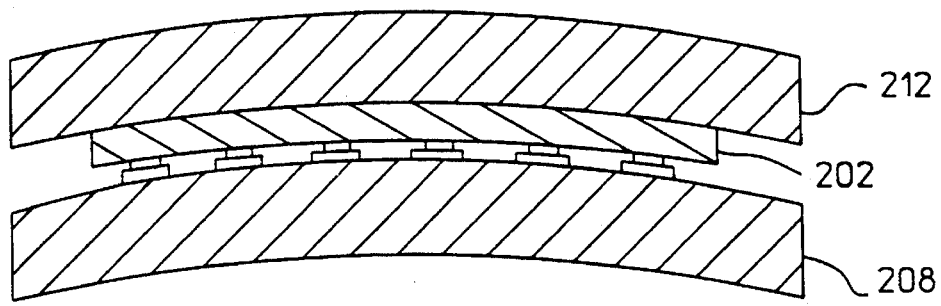
Figure 3:
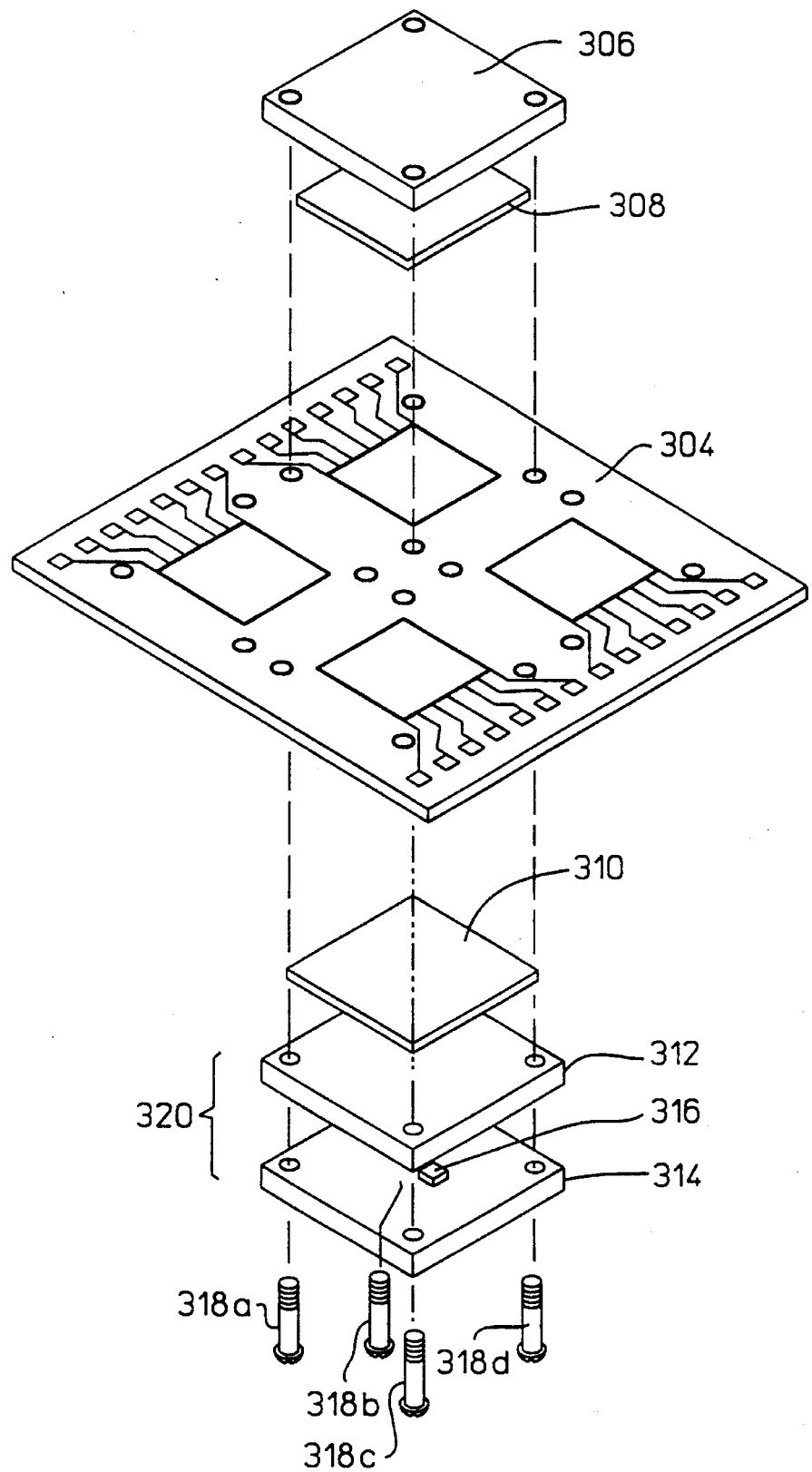
FIG. 3 shows an exploded view of the placement of one demountable flip chip on a substrate designed for placement of four demountable flip chips.

FIGS. 2F–2H shows the force delivery of the application of force to the embodiment shown in FIG. 2A. FIG. 2F shows the initiation of force applied as shoulder bolts 228 are threaded into the die attach plate 212 pressing the die 202 towards the substrate 208. The force from the shoulder bolts 228 results in the application of a force as seen by force arrows 254 around the periphery of the electrical assembly. For clarity, the shoulder bolts 228 and sealing means 224 are not shown in FIGS. 2F–2H. At the initiation of the force application shown by force arrows 254, the die attach plate 212, and plates 236, 238 of spring system are essentially parallel to the substrate 208. A downward force seen by force arrows 254a is applied to the die attach plate 212, forcing the die attach plate 212 towards the input/output pads 210 on the substrate 208. A second force shown by force arrows 254b forces the substrate 208 upwards towards the die 202.

FIG. 2G shows a partial force delivery diagram showing only the first plate 236 of the spring system. As can be seen in FIG. 2G, a downward force is applied around the periphery of the die attach structure 212 by force arrows 254a. FIG. 2G also shows a second force application arrow 254c illustrating the force applied to the first plate 236. The force 254c is transferred from the second plate 238 to the first plate 236 via the spacer 240. The spacer 240, centered near the middle of the first and second plates 236, 238, transfers force from the second plate 238 to the center of the first plate 236.

FIG. 2H illustrates a partial force delivery diagram including the first plate 236 of the spring system, the die 202 and the die attach structure 212. FIG. 2H shows the curvatures of the die attach plate 212, the die 202, and the substrate 208 resulting from the application of force 254. Because holes 244, 248, 250 are around the periphery of the electrical assembly to avoid the die 202, the curvature resulting from the applied forces 254 is around the periphery of the electrical assembly. Referring to FIG. 2F–2H, the force 254a of the shoulder bolts creates a downward force that bends the outer edges of the die attach plate 212 so that the die attach plate 212 and attached die 202 form a structure slightly concave and curved inward around the die 202. Similarly, the force 254c applied to the center of the first plate 236 as seen in FIG. 2G, causes the first plate 236 to curve around the point of application of force in the same direction as the curvature of the die attach plate 212. Because the first plate 236 of the spring system is coupled to the substrate 208, the substrate 208 also curves around the point of application of force in the same direction as the curvature of the die attach plate 212. Thus the two part spring system applies a force which causes the curvature of the die 202 and the curvature of the substrate 208 to be in the same direction. Forcing the curvature of the die 202 and the substrate 208 in the same direction ensures reliable electrical contact. Further refinement is achievable by tailoring the size, thickness and materials of the plates 236 and 238 in such a way that the curvature of the die 212 and the substrate 208 are not only in the same direction but also have the same radius of curvature.

FIGS. 2C, 2D, and 2E show alternative embodiments of the spring system shown in FIGS. 2A and 2B. In FIG. 2C, the first plate 236 is shorter in length than the second plate 238. In the spring system shown in FIG. 2D, the first plate 236 does not extend past the fasteners 228 placed around the periphery of the die and the first plate 236 typically has a length approximate to that of the die 202. In the embodiment shown in FIG. 2D, the first plate 236 coupled to the substrate 208 is T shaped having a narrower base region 252 and a wider cap region 254 coupled to substrate 208. The base region 252 does not extend past the shoulder bolts 228. The base region 252 is separated from the second plate 238 by a spacer 240. Both the embodiment shown in FIG. 2C and 2D transfer force from the second plate 238 to the center of the first plate 236 via the spacer 240. This force transfer results in a flexure of the first plate 236 having the same direction of curvature as the die attach plate 212. The flexure in the first plate 236 causes the substrate 208 to flex in the direction of the die attach plate 212 resulting in superior electrical contact.

In the embodiment shown in FIG. 2E, the spring system is a stiffener-cum-spring having a plateau in the center. The spring 260 is similar in form to the T shaped first plate 236, except that the T shaped plate is inverted so that the base region 262 is coupled to the substrate 208. Also, compared to the spring system shown in FIG. 2, the spring system shown in FIG. 2E is comprised of only a single plate 258. The length of the base region 262 is typically equal to the length of the die 202. Shoulder bolts 228 pass through the holes in the spring 258, the substrate 208, and the die attach plate 212. Similar to the embodiments shown in FIG. 2A–2D, a force is applied to the center portion of the substrate 208. The force, which is applied by the base 262 of the spring 260, causes the substrate 208 to bend to have a curvature in the same direction as the curvature of the die causing good electrical connection.

The process of manufacturing the demountable flip chip 200 shown in FIG. 2 includes the steps of: mounting an integrated circuit die to a die attach structure, where the integrated has a plurality of contact areas, aligning the integrated circuit die with a substrate so that the contact areas of the integrated circuit die are aligned with the matching contact areas of the substrate, and applying forces to compress the substrate towards the integrated circuit die, where a first force results in a curvature of the integrated circuit die in a first direction, and a second force applied by a spring system results in a curvature of the substrate in the first direction.

Figure 6:
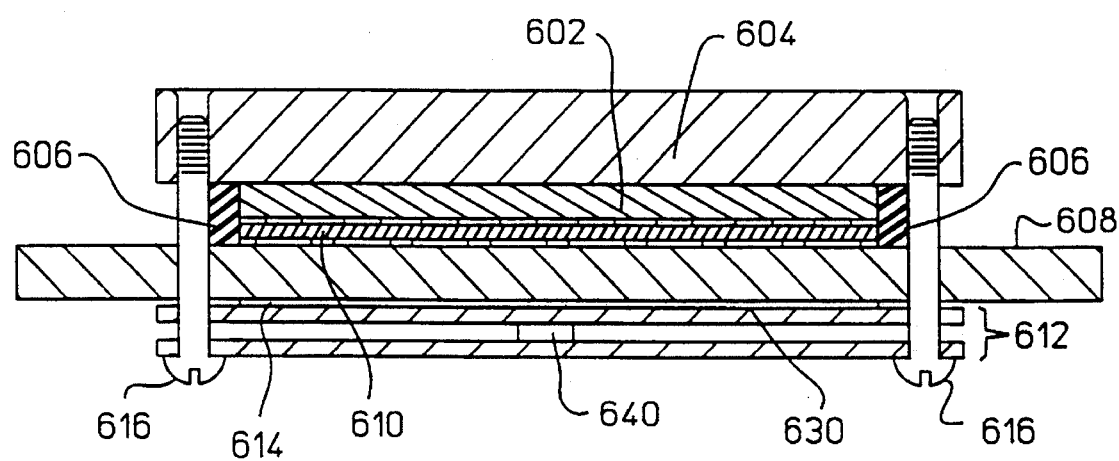
FIG. 6 shows an alternative spring system embodiment for a demountable chip.

FIG. 6 shows an alternate embodiment of an electrical assembly where a z-axis elastomer is used to provide electrical interconnection to a substrate. The demountable chip assembly 600 shown in FIG. 6 consists of a die 602 precision attached to a die attach plate or heat sink 604, a sealing ring 606 positioned around the die periphery, a substrate 608, a z axis elastomer 610 and a spring system 612. In the preferred embodiment, the die assembly 600 includes a second elastomer 614 positioned between the substrate 508 and the spring system 612 which acts as a load distributing member and is used to equalize the load applied across the substrate 608.

In contrast to the embodiment shown in FIGS. 2 and 3, however, in the embodiment shown in FIG. 6 a z-axis elastomer 610 is placed directly between the die 602 and the substrate 608. The z-axis elastomer 610 is used instead of the bump contact pattern found in typical flip chips. The contact pad pattern on the integrated circuit die matches the contact pad pattern on the substrate. Thus, the contact pads of the die are electrically connected to the contact pattern on the substrate via the veritcal wires in the z-axis elastomer. The registration of the die to the substrate is brought about by pressure contact through a combination of forces applied by the spring system 612 and, by threading shoulder bolts 616 through the precision holes in the substrate corresponding to the threaded holes in the die attach plate into which fasteners 616 are bolted in. The shoulder of the insert 616 forms an alignment pin to fit the hole in the substrate 608.

The die pads, the conducting wires in the z axis elastomer and the substrate pads would typically be on an area array. Z-axis elastomers currently available today provide pitches of conducting wires of 0.008 inches. For reference, it may be noted that 500 pads on a 0.5 inch×0.5 inch die require a rather coarse pad pitch of approximately 0.020 inches if placed in an area array as opposed to 0.003–0.004 inches if placed on the die periphery. The thickness of the z-axis elastomer is typically in the 0.020–0.040 inch range and the thickness of the silicone sealing ring is approximately equal to the thickness of the z-axis elastomer plus the thickness of the die. The elastomer should be strained by an amount which will provide a minimum of around 50 grams of force in each contact and an absolute compression of 0.005–0.010 inch.

Because the embodiment shown in FIG. 6 uses a z-axis elastomer to provide electrical communication between the die and the substrate, the process of forming the demountable electrical assembly shown in FIG. 6 further includes the step of positioning a z-axis elastomer between the die and the substrate.

In an alternative embodiment, the demountable chip assembly is produced by modifying the TAB packaging scheme. In the outer lead area, the bare TAB tape is surface mounted as usual (e.g. by soldering). Now, however, the chip assembly is used to effect a demountable pressure connection in the inner lead bond region, much like the outer lead bond in the DTAB bonding system describe for example in U.S. Pat. No. 5,053,922. This allows the inner lead area to be on an area array. In this embodiment, the z-axis elastomer can be omitted and an ordinary elastomer can be attached to the back of the tape in the inner lead area to provide pressure force contact.

It is understood that the above description is intended to be illustrative and not restrictive. For example, the alternative spring systems described in FIGS. 2C–2E may be used in place of the spring system described in FIG. 6. The important feature is that the spring system provide a curvature that is the same as the curvature of the integrated circuit die. Further, although typically each integrated circuit die has its own corresponding die attach plate and spring system, a plurality of integrated circuit die may share a die attach plate or a spring system. The scope of the invention should therefore be determined not with reference to the above description, but instead should be determined with reference to the appended claims, along with the full scope of equivalents to which such claims are entitled.

What is claimed is:

1. An electrical interconnection assembly comprising:

an interconnect substrate having a first major surface and a second major surface;

an integrated circuit die having a first major surface and a second major surface, wherein the second major surface is the active side of the integrated circuit die, the second major surface of the integrated circuit die having a plurality of contact areas;

a die attach structure spaced away from the interconnect substrate, the interconnect substrate having a first major surface and a second major surface, wherein the first major surface of the integrated circuit die is coupled to the die attach structure and the second major surface of the integrated circuit die is electrically coupled to the first major surface of the interconnect substrate; and a compression means for urging the first major surface of the interconnect substrate towards the second major surface of the integrated circuit die, the compression means applying a first force resulting in a curvature of the integrated circuit die in a first direction, the compression means further including a spring system, wherein the spring system results in a curvature of the substrate in the first direction.

2. The assembly recited in claim 1 wherein the spring system includes a stiffener cum-spring, the stiffener cum-spring having a base region and a cap region, wherein the base region is coupled to the second major surface of the interconnect substrate.

3. The assembly recited in claim 1 further including a sealing ring positioned around the periphery of the integrated circuit die between the second major surface of the die attach structure and the interconnect substrate.

4. The assembly recited in claim 1 wherein the spring system is comprised of a first and second plate separated by a spacing means.

5. The assembly recited in claim 4 wherein the first plate and second plate are substantially parallel.

6. The assembly recited in claim 4 wherein openings are formed in the die attach structure, the interconnect substrate and the first and second plates of the spring system.

7. The assembly recited in claim 6 wherein the openings in the die attach structure, the interconnect substrate and the spring system are positioned along the periphery of the die attach structure, the interconnect substrate and the first and second plates.

8. The assembly recited in claim 6 further including shoulder bolts positioned through the openings in the die attach structure, the interconnect substrate and the spring system such that placement of the shoulder bolts aligns the contact areas of the integrated circuit die with the contact areas of the interconnect substrate.

9. The assembly recited in claim 8 wherein screwing in the shoulder bolts results in a force causing the die attach structure to curve in a first direction downward around the integrated circuit die and a force causing the interconnect substrate to curve in a second direction upward towards the integrated circuit die.

10. The assembly recited in claim 9 wherein the force causing the interconnect substrate to curve in a second direction is applied to the second plate and responsive to the force applied to the second plate a force is transferred from the spacing means to the first plate.

11. The assembly recited in claim 10 wherein responsive to the force transferred to the first plate, the first plate curves in a first downward direction so that the direction of curvature is the same as the direction of curvature of the integrated circuit die.

12. The assembly recited in claim 1 further including a z axis elastomer positioned between the printed circuit interconnect substrate and the integrated circuit die.

13. A method of forming an electrical interconnection assembly including the steps of:

mounting an integrated circuit die having a first and second major surface to a die attach structure having a first and second major surface, the second major surface of the integrated circuit die being the active side of the integrated circuit die, the second major surface of the integrated circuit die having a plurality of contact areas;

aligning the integrated circuit die with a substrate having a first and second major surface, the first major surface of the substrate including a plurality of contact areas corresponding to the plurality of contact areas on the second major surface of the integrated circuit die, the integrated circuit die aligned with the substrate such that the plurality of contact areas on the integrated circuit die are electrically coupled to the plurality of contact areas on the substrate; and applying forces to compress the first major surface of the substrate towards the second major surface of the integrated circuit die, including a first force results in a curvature of the integrated circuit die in a first direction and a second force applied by a spring system results in a curvature of the substrate in the first direction.

14. The method recited in claim 13 wherein the step of aligning the integrated circuit die to the substrate further includes the steps of:

forming openings in the die attach structure, the substrate, and the spring system, wherein the openings being precision drilled to align the contact areas of the die with the contact areas of the substrate; and positioning a fastening means through the openings in the die attach structure, the substrate, and the spring system.

15. The method recited in claim 13 further including the step of placing a sealing means around the die such that the sealing means is positioned between the die attach structure and the substrate.

* * * * *